United States Patent [19]

Tsang

[11] Patent Number: 5,224,113
[45] Date of Patent: Jun. 29, 1993

[54] SEMICONDUCTOR LASER HAVING REDUCED TEMPERATURE DEPENDENCE

[75] Inventor: Won-Tien Tsang, Holmdel, N.J.

[73] Assignee: AT&T Bell Laboratories, Murray Hill, N.J.

[21] Appl. No.: 812,906

[22] Filed: Dec. 20, 1991

[51] Int. Cl.$^5$ .............................................. H01S 3/19
[52] U.S. Cl. ....................................... 372/45; 372/49; 372/34; 372/96
[58] Field of Search .................... 372/49, 45, 96, 34, 372/36

[56] References Cited

U.S. PATENT DOCUMENTS

| | | | |
|---|---|---|---|
| 4,092,659 | 5/1978 | Ettenberg | 372/49 |
| 4,599,729 | 7/1986 | Sasaki et al. | 372/49 |
| 4,745,615 | 5/1988 | Kaneiwa et al. | 372/96 |

FOREIGN PATENT DOCUMENTS 0045084  3/1985  Japan .................... 372/96

Primary Examiner—Georgia Y. Epps
Attorney, Agent, or Firm—Glen E. Books

[57] ABSTRACT

In accordance with the present invention a semiconductor laser is provided with a cavity having decreasing loss with increasing wavelength in order to reduce temperature dependence. Such decreasing loss canbe obtained by providing the laser cavity with reflecting means or gratings which favor longer wavelengths. Decreasing loss can be provided, for example, by provision of appropriate multilayer reflection coatings or by longitudinal gratings. The coatings advantageously have peak reflectivity centered at the lasing wavelength corresponding to maximum operating temperature. The result in long wavelength InGaAs lasers is an improvement in the threshold temperature coefficient from about 50K to about 85K. In addition, the improved lasers exhibited a decreased rate of quantum efficiency degradation with temperature.

8 Claims, 2 Drawing Sheets

SEMICONDUCTOR LASER HAVING REDUCED TEMPERATURE DEPENDENCE

FIELD OF THE INVENTION

This invention relates to semiconductor lasers and, in particular, to a semiconductor laser having reduced temperature dependence for threshold current and quantum efficiency.

BACKGROUND OF THE INVENTION

Semiconductor lasers are attractive for a wide variety of applications including telecommunications, computing systems, optical recording systems and optical interconnection of integrated circuits. Semiconductor lasers provide a compact source of coherent, monochromatic light which can be modulated at high bit rates to transmit large amounts of information.

One difficulty with semiconductor lasers is that their threshold current for lasing $I_{th}$ and their quantum efficiency is dependent on temperature. As a consequence thermal-electric coolers are typically required. However, for many applications, such as data links and fiber-to-the-home, thermal coolers are unduly expensive, and other means of reducing temperature dependence must be found.

The temperature dependence of threshold current of a semiconductor laser is customarily described by the empirical expression:

$$I_{th}(T) = \alpha \exp(T/T_o),$$

where To is a curve-fitting constant characteristic of the laser material system and the laser design. For 1.3-1.55 micrometer wavelength InGaAsP/InP lasers, To is about 50K for both bulk active double heterostructure lasers and for multiquantum well lasers. While it was hoped that the multiquantum well lasers would exhibit a higher To and hence reduce temperature dependence, no significant increase in To has thus far been observed. Accordingly, there is a need for a semiconductor laser having reduced temperature dependence.

SUMMARY OF THE INVENTION

In accordance with the present invention a semiconductor laser is provided with a cavity having decreasing loss with increasing wavelength in order to reduce temperature dependence. Such decreasing loss can be obtained by providing the laser cavity with reflecting means or gratings which favor longer wavelengths. Decreasing loss can be provided, for example, by provision of appropriate multilayer reflection coatings or by longitudinal gratings. The coatings or gratings advantageously have peak reflectivity centered at the lasing wavelength corresponding to maximum operating temperature. The result in long wavelength InGaAs lasers is an improvement in the threshold temperature coefficient from about 50K to about 85K. In addition, the improved lasers exhibited a decreased rate of quantum efficiency degradation with temperature.

BRIEF DESCRIPTION OF THE DRAWINGS

The advantages, nature and various additional features of the invention will appear more fully upon consideration of the illustrative embodiments now to be described in detail in connection with the accompanying drawings. In the drawings.

It is to be understood that these drawings are for purposes of illustrating the concepts of the invention and are not to scale.

DETAILED DESCRIPTION

Figure 1:
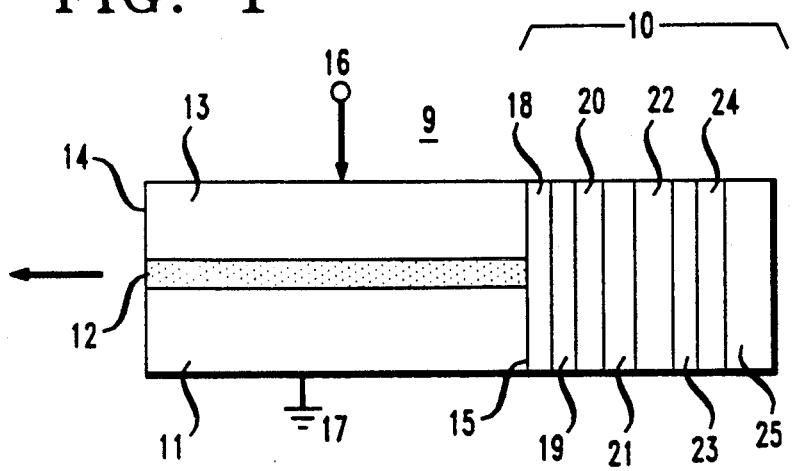
FIG. 1 is a schematic cross section of a first embodiment of a semiconductor laser in accordance with the invention.

Referring to the drawing, FIG. 1 is a schematic cross section of a first embodiment of a semiconductor laser having a cavity loss which decreases with increasing wavelength. In essence the embodiment comprises a conventional semiconductor laser 9 modified by stack 10 of reflection coatings at one or both facets to produce decreasing loss with increasing wavelength.

Semiconductor laser 9 typically comprises a plurality of epitaxial semiconductor layers grown on a monocrystalline semiconductor substrate (not shown). For example, layer 11 can be a layer of n-type semiconductor such as indium phosphide doped with silicon or tin to a concentration in the range $5 \times 10^{17} - 1 \times 10^{18}$ cm$^{-3}$. Layer 12, which is the optically active region in which photons are generated, can be a different semiconductor having a narrower bandgap than layer 11, such as InGaAsP, and layer 13 can be a semiconductor similar to layer 11 but having the opposite (here p-type) conductivity, such as indium phosphide doped with zinc to a concentration in the range $5 \times 10^{17}$ to $1 \times 10^{18}$ cm$^{-3}$. Transverse end surfaces 14 and 15 of the laser are polished facets to provide optical feedback, and electrical contact means 16 and 17 are provided for flowing electrical current transversely through the successive layers for producing lasing in layer 12. The layers constituting laser 9 can be grown using chemical beam epitaxy or metalorganic chemical vapor deposition techniques well known in the art. These layers, the facets at their ends and any coatings thereon define the laser cavity.

The portion of the laser which interacts with the light generated in active region 12 is referred to as the laser cavity. The laser cavity includes layer 12, the reflecting facets at end surfaces 14 and 15, any coatings on the facets, and portions of layers 11 and 13 adjacent to layer 12. The laser cavity presents a characteristic loss to light traveling within the laser which is important in determining the threshold current for lasing. In conventional semiconductor lasers this characteristic loss is essentially independent of temperature.

In this embodiment, one or both facets of the laser are provided with a stack 10 of reflection coatings for producing decreasing loss with increasing wavelength. Preferably the coatings are chosen to produce peak reflectivity at the lasing wavelength at the highest anticipated operating temperature. The general method of designing such multilayer stacks is described by O. S. Heavens, *Optical Properties of Thin Solid Films*, (Dover, 1965). In the preferred example of a 1.5 micrometer InGaAsP/InP laser, stack 10 can comprise alternate layers of silicon dioxide and silicon. Specifically layers 18, 20, 22 and 24 are SiO$_2$ having respective thicknesses of 2627 Å, 2636 Å, 2653 Å and 2653 Å. Layers 19, 21, 23, and 25 are silicon having respective thicknesses of 1287 angstrom, 1292 Å, 1300 Å and 1300 Å. These layers can be conveniently deposited on laser facets using high vacuum evaporation techniques well known in the art. The thickness of the layers can be precisely monitored during deposition by a quartz transducer to produce the specified thicknesses.

Figure 2:
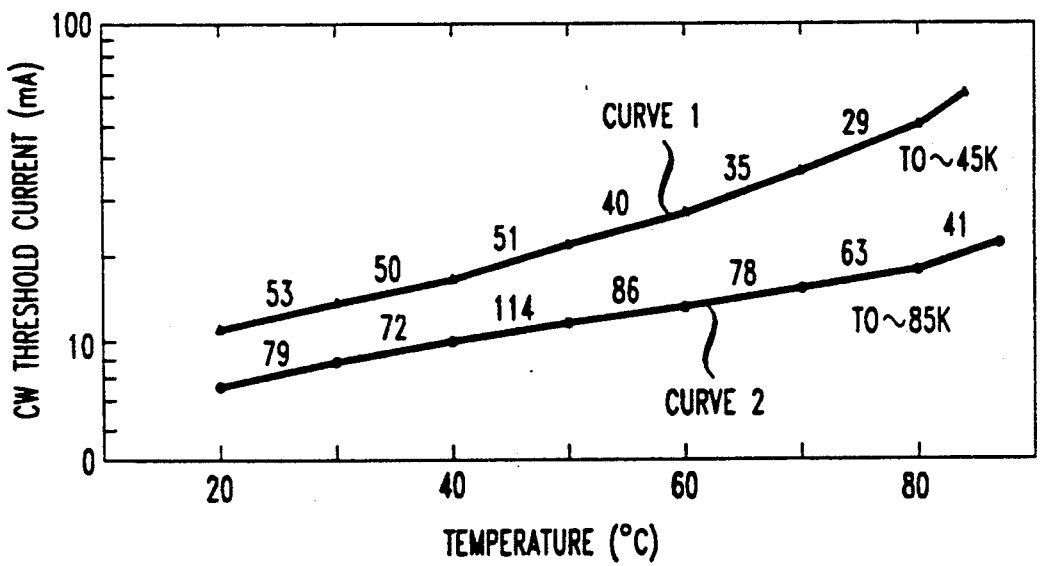
FIG. 2 is a plot of threshold current versus temperature for the laser of FIG. 1.

The result of the modified laser cavity is reduced temperature dependence. FIG. 2 is a plot of continuous wave threshold current as a function of temperature for two semiconductor lasers. Curve 1 is for a conventional semiconductor laser without coatings. Curve 2 is for a similar laser with coatings. As can be seen, at all temperatures between 20° C. and 80° C., the coated laser exhibits a lower threshold current and a lower rate of increase of threshold current with increasing temperature.

Figure 3:
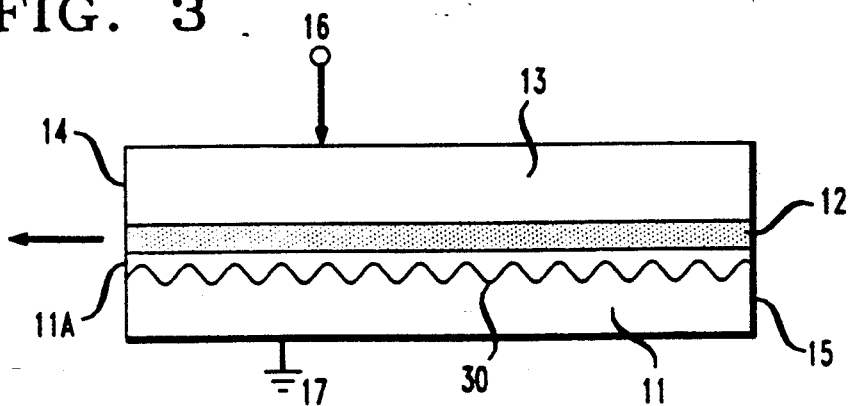
FIG. 3 is a schematic cross section of a second embodiment of a semiconductor laser in accordance with the invention.

FIG. 3 is a schematic cross section of a semiconductor laser in accordance with the invention wherein a grating, rather than coatings, is used to achieve a laser cavity loss which decreases with increasing wavelength. In this embodiment the laser differs from laser 9 of FIG. 1 in that the coating stack 10 has been omitted and in that a longitudinal periodic grating 30 has been formed in n-layer 11 and filled in with a second epitaxially compatible n-type semiconductor 11A. For an n-doped indium phosphide layer 11, layer 11A can be n-doped InGaAsP.

The period $\Lambda$ of grating 30 is chosen to favor a lasing wavelength corresponding to the highest anticipated operating temperature, e.g. to favor 1.56 micrometer lasing at 85° C. for a 1.5 micrometer laser. Specifically, if $\lambda$ is the desired wavelength and N is the effective refractive index in the laser, then $\Lambda = \lambda/2N$. The depth of the grating is preferably chosen so that the optical feedback from the grating is weak compared to the feedback from the facets. As a specific example, for the above-described laser, $\Lambda$ can be 2400 Å and the grating depth can be less than about 100 Å. Such gratings can be made using wet etching or reactive ion etching in conjunction with conventional holographic patterning techniques.

Figure 4:
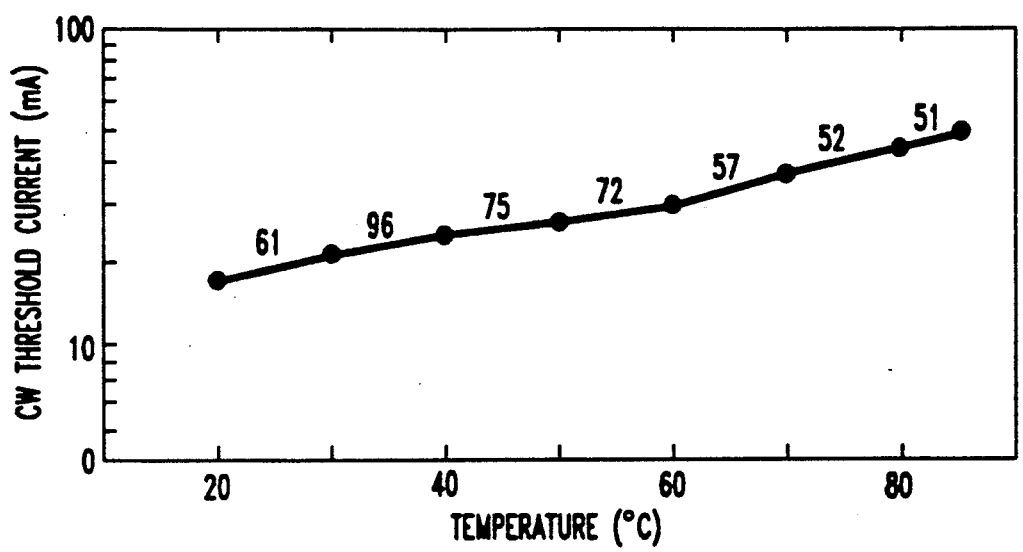
FIG. 4 is a plot of threshold current versus temperature for the laser of FIG. 3.

FIG. 4 is a graphical illustration showing the continuous wave threshold current of the device of FIG. 3 as a function of temperature.

While not necessary to the invention, the applicants offer the following explanation of the reduced temperature dependence of semiconductor lasers in accordance with the invention. In a semiconductor laser, the total cavity loss $\alpha_{total}$ is given by $$\alpha_{total} = \frac{1}{\Gamma}\left[\alpha_i + \frac{1}{2L} \ln\left(\frac{1}{R_1 * R_2}\right)\right]$$

where $\Gamma$ is the confinement factor of the laser waveguide, $\alpha_i$ is the effective internal loss, L is the cavity length, $$\frac{1}{2L} \ln\left(\frac{1}{R_1 * R_2}\right)$$

is the effective distributed mirror loss, and $R_1$ and $R_2$ are the facet reflectivities. The laser reaches the lasing threshold when the gain G of the active medium overcomes the total cavity losses, i.e. when $G_{th} = \alpha_{total}$ where $G_{th}$ is the gain at losing threshold.

Figure 5:
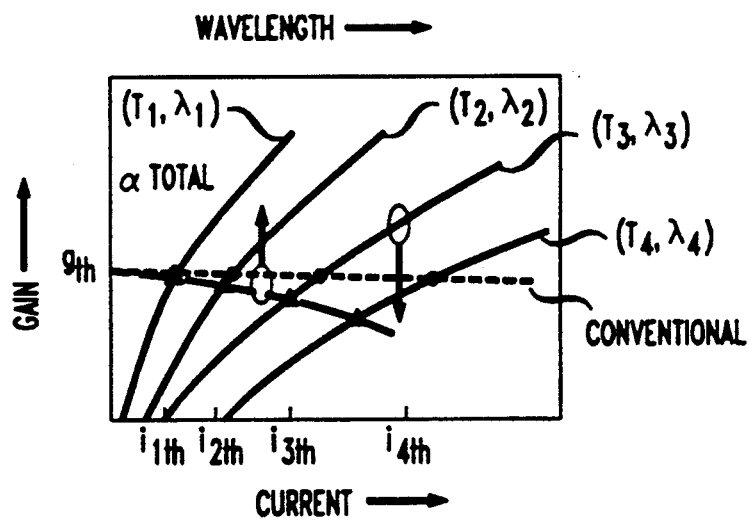
FIGS. 5 and 6 are graphical plots useful in explaining the operation of the lasers of FIGS. 1 and 3.

At a given temperature, the G of the medium increases with increasing injection current and gradually becomes saturated. As shown in FIG. 5, as the temperature is increased from $T_1$ to $T_4$, the gain decreases and the gain peak shifts in wavelength from $\lambda_1$ to $\lambda_4$.

For conventional semiconductor lasers, the total cavity loss $\alpha_{total}$ is essentially independent of temperature and wavelength. This is illustrated by the dashed line in FIG. 5. The threshold currents for conventional lasers are the currents at the intersections between the $\alpha_{total}$ dashed line and the respective (T,$\lambda$) curves.

Figure 6:
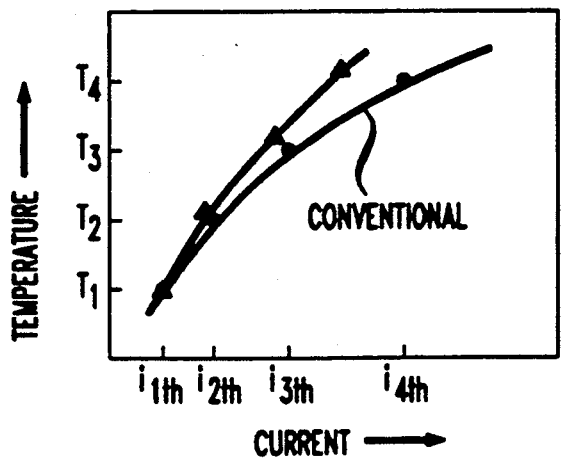

For a laser in accordance with the invention, however, the total cavity losses decrease with increasing wavelength. Thus the $\alpha_{total}$ is represented by the dotted line of FIG. 5. As illustrated, the threshold currents are the currents at the intersections (shown by triangles) between the $\alpha_{total}$ dotted line and the respective (T,$\lambda$) curves. For each (T,$\lambda$), the threshold currents are lower than for the conventional structure. This effect is clearly illustrated in FIG. 6 which plots the threshold currents in FIG. 5 versus temperature.

It is to be understood that the above-described specific embodiments are illustrative of only a few of the many possible specific embodiments which can represent applications of the principles of the invention. Numerous and varied other arrangements can be made by those skilled in the art without departing from the spirit and scope of the invention.

I claim:

1. In a semiconductor laser for operating over a range of temperatures of the type comprising a layer of n-type semiconductor, a layer of p-type semiconductor, a layer of optically active semiconductor disposed between said n-type and p-type layers, and a laser cavity for interacting with light generated in said optically active semiconductor, the improvement wherein said laser cavity is chosen and adapted to exhibit a total cavity loss which decreases with increasing optical wavelength up to the peak lasing wavelength at the highest temperature of said range whereby said laser exhibits reduced temperature dependence of threshold current over said temperature range.

2. The improved semiconductor laser of claim 1 wherein said total cavity loss decreases with increasing wavelength up to a peak wavelength corresponding to the lasing wavelength at about 85° C.

3. The improved semiconductor laser of claim 1 wherein said laser further comprises transverse end facets and at least one of said end facets is provided with reflecting means providing increasing reflectivity for wavelengths of increasing length.

4. The improved semiconductor laser of claim 1 wherein said laser further comprises longitudinal grating means for providing decreasing loss.

5. A semiconductor laser comprising a layer of n-type indium phosphide, a layer of p-type indium phosphide, a layer of InGaAsP disposed between said n-type and p-type layers, said layers having end facets defining a laser cavity therebetween, and a plurality of reflective coatings on at least one of said end facets for producing a total cavity loss which decreases with increasing wavelength.

6. A laser according to claim 5 wherein said reflective coatings comprise alternate layers of silicon and silicon dioxide.

7. A semiconductor laser comprising a layer of n-type indium phosphide, a layer of p-type indium phosphide, a layer of InGaAsP disposed between said n-type and p-type layers, said layers having transverse end facets defining a laser cavity therebetween, and a longitudinally extending grating in one of said layers for producing a total cavity loss which decreases with increasing wavelength.

8. A semiconductor laser according to claim 7 wherein said laser exhibits an effective refractive index N, an optical wavelength $\lambda$ at a preselected highest operating temperature, and said longitudinally extending grating has $\Lambda = \lambda/2N$.

* * * * *